US007858152B2

(12) United States Patent
Ovshinsky et al.

(10) Patent No.: US 7,858,152 B2
(45) Date of Patent: Dec. 28, 2010

(54) CHEMICAL VAPOR DEPOSITION OF CHALCOGENIDE MATERIALS VIA ALTERNATING LAYERS

(75) Inventors: Stanford R. Ovshinsky, Bloomfield Hills, MI (US); Smuruthi Kamepalli, Rochester, MI (US)

(73) Assignee: Ovonyx, Inc., Troy, MI (US)

( * ) Notice: Subject to any disclaimer, the term of this patent is extended or adjusted under 35 U.S.C. 154(b) by 121 days.

(21) Appl. No.: 12/284,425

(22) Filed: Sep. 22, 2008

(65) Prior Publication Data

US 2009/0022883 A1     Jan. 22, 2009

Related U.S. Application Data

(63) Continuation of application No. 11/046,114, filed on Jan. 28, 2005, now abandoned.

(51) Int. Cl.
    *C23C 16/00*     (2006.01)
(52) U.S. Cl. ............... 427/331; 427/255.28; 427/248.1; 427/255.31; 427/255.29; 427/532; 427/402
(58) Field of Classification Search .............. 427/248.1, 427/255.29, 255.35, 255.7, 402
See application file for complete search history.

(56) References Cited

U.S. PATENT DOCUMENTS 5,312,983 A * 5/1994 Brown et al. ................ 562/899
5,492,725 A * 2/1996 Gordon ................... 427/248.1
6,011,757 A * 1/2000 Ovshinsky ............... 369/13.35
6,519,573 B1 * 2/2003 Shade et al. .................. 705/26
6,984,591 B1 * 1/2006 Buchanan et al. ........... 438/778
7,161,167 B2 * 1/2007 Johnson ......................... 257/5
2003/0001229 A1 * 1/2003 Moore et al. ................ 257/528

FOREIGN PATENT DOCUMENTS

JP     2002117574 A   *   4/2002

* cited by examiner

*Primary Examiner*—David Turocy
(74) *Attorney, Agent, or Firm*—Kevin L. Bray

(57) ABSTRACT

A chemical vapor deposition (CVD) process for preparing electrical and optical chalcogenide materials. In a preferred embodiment, the instant CVD-deposited materials exhibit one or more of the following properties: electrical switching, accumulation, setting, reversible multistate behavior, resetting, cognitive functionality, and reversible amorphous-crystalline transformations. In one embodiment, a multilayer structure, including at least one layer containing a chalcogen element, is deposited by CVD and subjected to post-deposition application of energy to produce a chalcogenide material having properties in accordance with the instant invention. In another embodiment, a single layer chalcogenide material having properties in accordance with the instant invention is formed from a CVD deposition process including three or more deposition precursors, at least one of which is a chalcogen element precursor. Preferred materials are those that include the chalcogen Te along with Ge and/or Sb.

74 Claims, 15 Drawing Sheets

PRIOR ART

Tris(dimethylamino)antimony    Diisopropyltellurium

Isobutylgermane

CHEMICAL VAPOR DEPOSITION OF CHALCOGENIDE MATERIALS VIA ALTERNATING LAYERS

RELATED APPLICATION INFORMATION

This application is a continuation of U.S. patent application Ser. No. 11/046,114 entitled "Chemical Vapor Deposition of Chalcogenide Materials" and filed on Jan. 28, 2005, now abandoned, the disclosure of which is hereby incorporated in its entirety herein.

FIELD OF INVENTION

This invention relates to a process for preparing chalcogenide materials. More particularly, this invention relates to the formation of thin film chalcogenide materials through a metalorganic chemical vapor deposition process. Most particularly, this invention relates to the metalorganic chemical vapor deposition of chalcogenide materials comprising Ge, Sb and Te.

BACKGROUND OF THE INVENTION

Chalcogenide materials are materials that contain a chalcogen element (O, S, Se, Te) and typically one or more additional elements that serve to modify electronic or structural properties. The II-VI semiconductors (e.g. CdS, ZnTe etc.) are a well-known class of chalcogenide materials. These materials have been widely investigated for their wide bandgap properties and their potential for providing short wavelength light emission for LED and laser applications.

Another important class of chalcogenide materials includes the expansive series of chalcogenide materials, initially developed by S. R. Ovshinsky, that are currently being used in optical and electrical memory and switching applications. These chalcogenide materials may be referred to herein as Ovonic chalcogenide materials. Among the Ovonic chalcogenide materials are chalcogenide phase change materials that are currently widely in use in optical recording technologies. The active materials in CD and DVD applications are chalcogenide materials that have a crystalline state and an amorphous state whose relative proportions can be reversibly and reproducibly varied through the application of optical energy. These materials can be used to store information by defining a series of two or more distinct structural states, each of which is defined by a characteristic proportion of crystalline and amorphous phase domains within a given volume, and associating a distinct information value to each structural state. Storage of an information value occurs by applying optical energy to the phase change material in an amount necessary to convert the material to the structural state associated with the information value.

The optical phase change chalcogenide materials are reversibly transformable between different structural states through the judicious application of energy. The proportion of amorphous phase can be increased by applying energy sufficient to create a local temperature in the phase change material that exceeds the melting temperature and removing the energy at a rate sufficient to prevent crystallization upon cooling. The proportion of crystalline phase can be increased by applying energy sufficient to create a local temperature in the phase change material that exceeds the crystallization temperature so that a controlled transformation of amorphous phase material to crystalline phase material is induced. Reading of the information content of the phase change material occurs through the detection of a physical characteristic of the structural state of the material. In optical recording, for example, reflectivity is a widely used as a parameter for detecting the structural state. The reflectivity difference between the crystalline and amorphous states provides sufficient contrast to permit clear resolution of structural states that differ with respect to the relative proportions of crystalline and amorphous phase volume fractions.

Two other important types of Ovonic chalcogenide materials are the electrical switching and electrical memory materials. The Ovonic electrical switching chalcogenide materials are switchable between a resistive state and a conductive state upon application of a threshold voltage. In the resistive state, the materials inhibit the flow of electrical current and upon application of the threshold voltage, the material switches nearly instantaneously to its conductive state to permit the flow of current. In the Ovonic electrical memory materials, application of electrical energy (typically in the form of current pulses) induces changes in the structural state of the chalcogenide material. The relative volume fraction of crystalline and amorphous phase domains can be continuously varied through judicious control of the duration and magnitude of a series of one or more applied current pulses. Each structural state has a unique resistance and each resistance value can be associated with a distinct information value. By applying an appropriate current pulse, the electrical chalcogenide memory material can be programmed into the resistance state that corresponds to a particular information value to write that value to the material. The electrical memory material can be transformed among its different resistance states to provide erasing and rewriting capabilities. Both the electrical and optical chalcogenide memory materials can be incorporated into arrays to provide advanced, high density memory capability.

As the appreciation of the range of applications of available from chalcogenide materials grows, greater attention is being placed on further understanding their properties and on developing new chalcogenide materials that exhibit a wider range of properties. The development of new materials requires the synthesis or deposition of either new compositions or existing compositions having unique microstructures. The primary preparation methods for the optical and electrical chalcogenide materials are sputtering and physical vapor deposition. Although these techniques have provided for a number very interesting and useful materials, it is expected that the development of new synthetic or preparation methods will expand the range of compositions and properties of chalcogenide materials and will further the objective of expanding the applications of chalcogenide materials.

Chemical vapor deposition, hereinafter referred to as CVD, is a widely used technique for the synthesis of materials. In the CVD process, precursors of the constituent elements of a material are reacted to produce a thin film on a substrate. The reaction of the CVD precursors occurs either homogeneously in the gas phase or heterogeneously at the solid-gas interface of the substrate surface. Precursors for many elements are available and a variety of thin film compositions can be synthesized using CVD.

In CVD processing, precursors are introduced into the reactor in gas phase form. Precursors that are in the gas phase at room conditions are directly introduced into the reactor, typically in diluted form via a carrier gas. Liquid and solid phase precursors are vaporized or sublimed and then introduced into the reactor, also typically in diluted form in the presence of a carrier gas. Upon introduction into the reactor, precursors containing the chemical constituents of the desired material are decomposed (thermally, photochemically, or in a plasma) to provide intermediate species of the constituents that subsequently react to form a thin film of desired composition. The rate of deposition, stoichiometry, composition and morphology of the film can be varied through appropriate control over process parameters such as reaction temperature; substrate; selection of precursor; reactor pressure; and the rate of introduction of precursors into the reactor. CVD offers the advantages of providing high purity thin films at relatively low temperatures.

Although CVD, has been widely used for II-VI materials that contain chalcogenide elements and simple binary chalcogenides such as $Sb_2Te_3$, its use for the Ovonic family of optical and electrical chalcogenide materials has been virtually non-existent due to the anticipated difficulties associated with producing the multiple element (ternary and higher) compositions typically associated with the most effective optical and electrical switching and memory chalcogenide materials. CVD synthesis of the optical and electrical switching and memory chalcogenides is an outstanding challenge that remains to be addressed. Successful development of the CVD synthesis of these materials is expected to provide a wider range of compositions with more diverse switching, memory and phase change characteristics and accordingly will provide new materials that can fulfill the ever-increasing expectations for chalcogenide materials.

SUMMARY OF THE INVENTION

This invention provides a chemical vapor deposition (CVD) process for preparing chalcogenide materials suitable for use in optical and electrical switching and memory applications. A chalcogenide precursor is reacted with one or more precursors containing other elements to produce a chalcogenide thin film in a CVD process.

In one embodiment, the chalcogenide thin film is an optical phase change material that is reversibly transformable between a high reflectivity state and a low reflectivity state upon application of optical energy, where the high reflectivity and low reflectivity states differ in fractional crystallinity.

In another embodiment, the chalcogenide thin film is an electrical switching material that can be switched from a high resistance state to a low resistance state upon application of a threshold voltage, where the low resistance state includes at least a filamentary portion that exhibits high conductivity.

In another embodiment, the chalcogenide thin film is an electrical memory material in which the relative proportions of crystalline and amorphous phase volumes can be varied through the application of an electrical signal.

In a preferred embodiment, the instant CVD-prepared chalcogenide material comprises Te.

In another preferred embodiment, the instant CVD-prepared chalcogenide material comprises Te and Ge.

In yet another preferred embodiment, the instant CVD-prepared chalcogenide material comprises Te and Sb.

In still another preferred embodiment, the instant CVD-prepared chalcogenide material is GeTe.

In still another preferred embodiment, the instant CVD-prepared chalcogenide material is $Sb_2Ge_2Te_5$.

The instant invention provides for chalcogenide deposition onto stationary or continuous web substrates.

DETAILED DESCRIPTION OF THE ILLUSTRATED EMBODIMENTS

Figure 1:
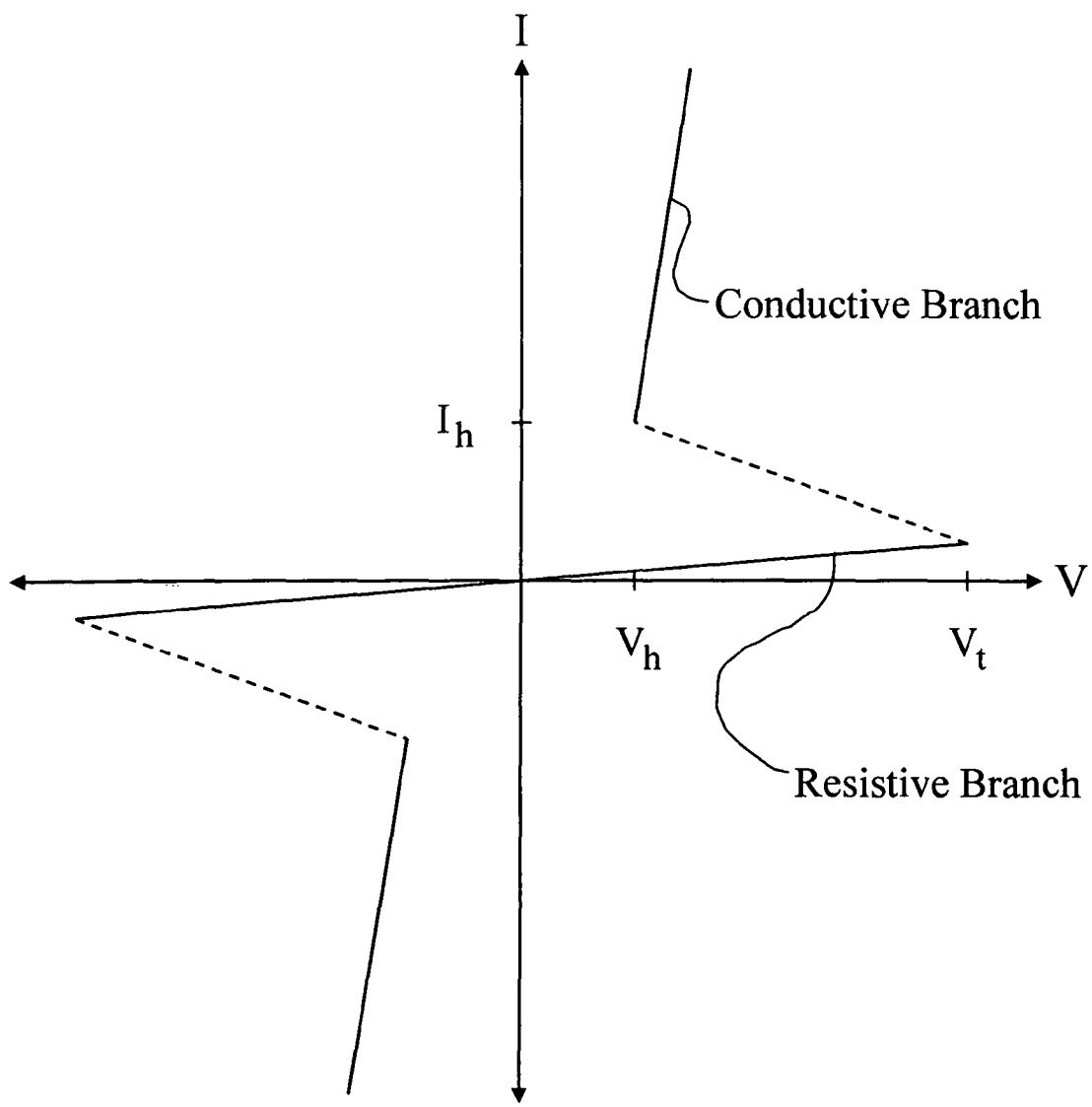
FIG. 1. Current-voltage characteristics of a chalcogenide material exhibiting a switching transformation.

The instant invention demonstrates the chemical vapor deposition (CVD) synthesis of optical and electrical chalcogenide materials in thin film form. As used herein, CVD encompasses all variations of chemical vapor deposition including those generally referred to in the art as VPE, MOVPE, MOCVD, OMVPE, OMCVD, PECVD and RPCVD.

A chalcogenide material within the scope of the instant invention is a material that includes at least one chalcogen element (S, Se, or Te) in an oxidized, reduced or neutral state. In a preferred embodiment, the chalcogenide materials include one or more non-chalcogen elements in combination with a chalcogen element.

In a preferred embodiment of the instant invention, a chalcogenide precursor is combined with one or more additional precursors in a CVD process to produce solid phase chalcogenide materials containing two or more elements. As used herein, a chalcogenide precursor is a chemical species that includes a chalcogen element and is able to contribute a chalcogen element during the formation and growth of a chalcogenide material in the instant CVD deposition process. The CVD deposition occurs in a CVD reactor or chamber. The CVD reactor includes a substrate onto which deposition occurs. The substrate can be a stationary substrate (e.g. a wafer) or a moving substrate (e.g. continuous web). The substrate can be lattice-matched to the CVD-deposited thin film or not. Growth precursors for the deposition are introduced into the CVD reactor and the reaction is commenced. During deposition, the reactor pressure and temperature are adjusted to optimize the deposition rate and purity of the thin film that is formed. Depending on the composition, substrate, reactor conditions, precursors etc. the thin film formed can be epitaxial, crystalline, polycrystalline, amorphous, homogeneous, heterogeneous etc.

Two CVD processing strategies are employed in the instant invention. In one embodiment, the instant chalcogenides are prepared through a direct CVD process, in which precursors for each element to be included in the ultimate thin film material are introduced simultaneously into a CVD reactor to form a multi-element chalcogenide material. In another embodiment, the instant chalcogenides are prepared through an alternating CVD process in which a penultimate multilayer structure is deposited, where each of the alternately deposited layers includes a different subset of the elements to be included in the intended ultimate composition and a post-CVD processing step is used to induce a transformation of the penultimate multilayer structure into the ultimate film.

Successful CVD synthesis of multiple element materials requires careful design of the precursor species. The CVD reaction is a gas phase reaction of precursors. It is therefore necessary to utilize gas phase precursors directly or to transform liquid and solid phase precursors into the gas phase prior to reaction. An important attribute of a precursor is the ability to introduce it at a steady and reproducible rate during the CVD reaction. Gas phase precursors are convenient for this purpose since they can be released and delivered to the reactor at a constant flow rate with a high degree of reproducibility. Oftentimes, gas phase precursors are diluted in a carrier gas such as He or Ar to control concentration in the reactor. Liquid and solid phase CVD precursors are also suitable, but require pre-delivery vaporization or sublimation prior to introduction into the CVD reactor. Vaporization or sublimation can be accomplished thermally or through entrainment in a carrier gas. Bubblers, for example, often used to deliver liquid phase precursors to CVD reactors. Solid phase precursors are often the most problematic in terms of achieving uniform precursor delivery rates because the surface area of a solid varies over the course of a deposition run. Mass flow controllers can be used to insure uniform delivery of vaporized or sublimed precursors into the CVD reactor.

Once the precursor is introduced into the CVD reactor, it reacts with other precursors to form a thin film. The reaction can occur through a gas phase reaction followed by deposition onto the substrate surface. Alternatively, the precursors can be decomposed (e.g. thermally or through plasma excitation) into reactive intermediate species (frequently including free radical species) that can combine in the gas phase or on the surface of the substrate to form the desired thin film. Many CVD reactions occur through decomposition of one or more precursors into reactive intermediate species that adsorb onto the substrate surface. Once on the surface, reactive species formed from different precursors react to form a multi-element thin film.

When binary or multi-element materials as ultimate thin films or layers within a multilayer penultimate structure are to be prepared, two or more precursors are introduced simultaneously into the CVD reactor. The complexity of the process increases due to the need to insure comparable rates of reaction or decomposition of the different precursors in the gas phase reaction environment of the reactor. When a multi-element material is prepared, it is beneficial for the precursors to provide the necessary elements at similar rates so that more nearly uniform and homogeneous thin films are formed. If one precursor reacts at a significantly faster rate than other precursors, the possibility arises that a film of non-uniform or undesired composition forms. A faster reacting precursor, for example, may deposit a mono-elemental layer onto the substrate before appreciable reaction or decomposition of slower reacting precursors has occurred. As a result, the stoichiometric ratio desired in the deposited material may be lacking. In the case of ternary and higher compositions, preferential reactions between a subset of the precursors may also occur and lead to the formation of a thin film that is depleted with respect to the element(s) of the non-preferentially reacting precursor(s). A further complication arises if the elements (or reactive species containing the elements) desired in the deposited film differ appreciably in volatility. Volatility is a relevant consideration because surface desorption of the desired elements (or species containing the desired elements) can occur during CVD deposition. If the different elements of a multi-element composition desorb at appreciably different rates from the surface, the intended stoichiometry may not be achieved.

The CVD preparation of multi-element compositions therefore requires careful selection of precursors and reaction conditions. The reactivity of CVD precursors is influenced by the conditions in the reactor (e.g. temperature, pressure, and concentration) as well as by the chemical features of the precursor itself. The conditions within the reactor can be varied to optimize the quality of deposited thin films for a given combination of precursors and the individual precursors can be optimized with respect to their intrinsic reactivity through control of the structure and bonding of the precursor. Most precursors include a central element or elements that one wishes to incorporate into a CVD thin film along with peripheral elements or groups that are bonded to the central element or elements. Many precursors, for example, include a central metal or non-metal atom that is bonded by one or more ligands that decompose in the CVD deposition during the formation of the reactive intermediate that contains the central element. The bond strength between such ligands and the central atom is typically an important contributing factor in the rate of reaction or decomposition of the precursor. Through judicious control of the ligands or other substituents, the reactivity of a precursor with respect to the delivery of elements desired in the deposited thin film can be controlled through control of relevant factors such as decomposition rate, reaction rate and desorption rate. Chemical tuning of the properties of CVD precursors is an important degree of freedom in multi-element depositions. Such chemical tuning can be used to identify and optimize combinations of precursors to improve the quality of multi-element films and to minimize incorporation of impurity elements into the deposited film.

The instant invention focuses on the CVD synthesis of chalcogenide materials in thin film form. In a preferred embodiment, the chalcogenide material is an optical or electrical chalcogenide material that is useful in optical and electrical memory and switching applications. In another preferred embodiment, the chalcogenide material is not a II-VI material and accordingly lack a column II element (Zn, Cd, or Hg) or Mg in the composition. In another preferred embodiment, the chalcogenide material includes Te and one or more non-chalcogen elements. In another preferred embodiment, the chalcogenide material includes a chalcogen element and Sb. In another preferred embodiment, the chalcogenide material includes a chalcogen element and Ge.

In one embodiment of the instant invention, chalcogenide materials that exhibit electrical switching are prepared in a CVD process. The switching properties of chalcogenide materials have been previously exploited in OTS (Ovonic Threshold Switch) devices. The OTS has been described in U.S. Pat. Nos. 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference.

The electrical switching properties of the chalcogenide materials used in the instant devices are schematically illustrated in FIG. 1, which shows the I-V (current-voltage) characteristics of a chalcogenide electrical switching material. The illustration of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are symmetric with respect to the polarity of the applied voltage. For convenience, we consider the first quadrant of the I-V plot of FIG. 1 (the portion in which current and voltage are both positive) in the brief discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the branch in which the current passing through the material increases only slightly upon increasing the voltage applied across the material. This branch exhibits a small slope in the I-V plot and appears as a nearly horizontal line in the first and third quadrants of FIG. 1. The conductive branch corresponds to the branch in which the current passing through the material increases significantly upon increasing the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide material. Regardless of the actual slopes, the conductive branch necessarily exhibits a larger slope than the resistive branch. When device conditions are such that the chalcogenide material is described by a point on the resistive branch of the I-V curve, the chalcogenide material or device may be said to be in a resistive state. When device conditions are such that the chalcogenide material is described by a point on the conductive branch of the I-V curve, the chalcogenide material or device may be said to be in a conductive state.

The switching properties of the electrical switching chalcogenide material used can be described by reference to FIG. 1. We consider a two-terminal device configuration and begin with a device that has no voltage applied across it. When no voltage is applied across the chalcogenide material, the material is in a resistive state and no current flows. This condition corresponds to the origin of the I-V plot shown in FIG. 1. The chalcogenide remains in a resistive state as the applied voltage is increased, up to a threshold voltage (labeled $V_t$ in the first quadrant of FIG. 1). The slope of the I-V curve for applied voltages between 0 and $V_t$ is small in magnitude and indicates that the chalcogenide material has a high electrical resistance, a circumstance reflected in the terminology "resistive branch" used to describe this portion of the I-V curve. The high resistance implies low electrical conductivity and as a result, the current flowing through the material increases only weakly as the applied voltage is increased. Since the current through the material is very small, the resistive state of the chalcogenide may be referred to as the OFF state of the material.

When the applied voltage equals or exceeds the threshold voltage, the chalcogenide material transforms (switches) from the resistive branch to the conductive branch of the I-V curve. The switching event occurs nearly instantaneously and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained.

In another embodiment, the material prepared by the instant CVD process is a chalcogenide material having one or more high resistance accumulation states, a detectably distinct low resistance state and one or more greyscale states having intermediate resistance. As used herein, high and low resistance states refer to physical states characterized by high and low electrical resistances, respectively, where the electrical resistances of the high and low electrical resistance states are relative to and detectably distinct from each other. The greyscale states have electrical resistance values intermediate between the high and low resistance states.

Figure 2:
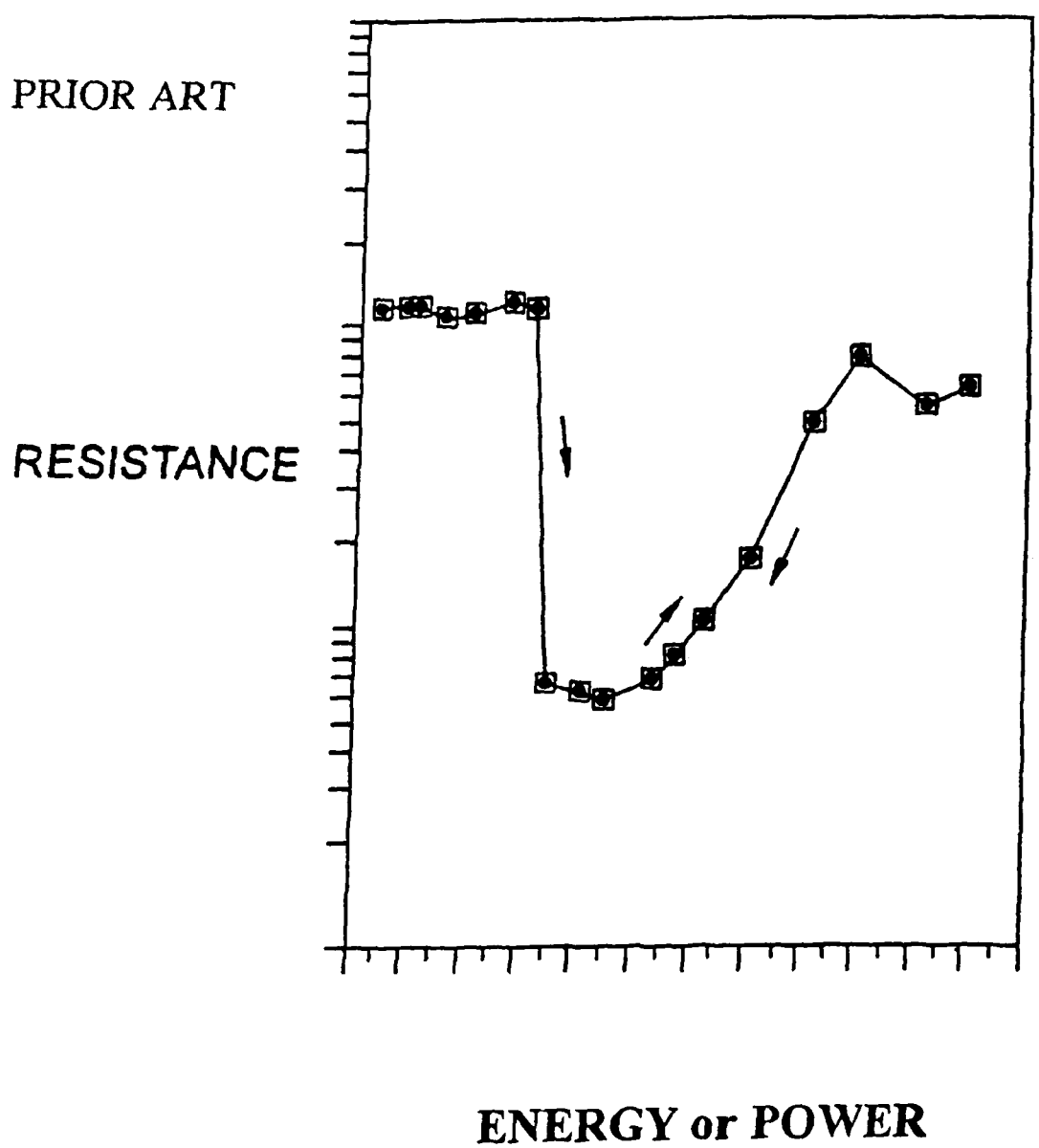
FIG. 2. Resistance characteristics of a chalcogenide material as a function of applied energy or power.

FIG. 2 disclosed herein is a plot of the electrical resistance as a function of energy or power of a representative chalcogenide material of this embodiment. The application of energy to the chalcogenide material permits interconversion among the different states as described hereinbelow. The electrical resistance plot can be broadly classified into an accumulation region and a greyscale region where the two regions are separated by a nearly discontinuous change in electrical resistance. The accumulation region corresponds to the high resistance plateau shown on the left side of FIG. 2 herein and the greyscale region corresponds to the remaining portion of the electrical resistance response shown on the right side of FIG. 2 herein.

The accumulation region includes a plurality of high resistance states, each of which has a similar electrical resistance. The slope in the accumulation region can be nearly horizontal, as shown in FIG. 2, or may exhibit a gradual slope. States in the accumulation region may be referred to as accumulation states. If the chalcogenide material is initially in a high resistance state, the application of small amounts of energy leaves the material in a high resistance state. This behavior is depicted by the high resistance plateau region shown on the left side of FIG. 2. If a sufficient amount of energy is applied, however, the chalcogenide material transforms from its high resistance state to its low resistance state. This transformation is depicted by the steep reduction in electrical resistance immediately to the right of the high resistance plateau region of FIG. 2. This transformation of the material from its high resistance state to its low resistance state may be referred to as "setting" or "to set" the phase change material. The low resistance state produced upon setting may be referred to as the "set state" of the phase change material. An amount of energy sufficient to set the material may be referred to as the "set energy" or "setting energy". Note that the set energy is different for each position or state along the high resistance plateau. The reset state may be viewed as the accumulation state having the highest setting energy.

The right side of FIG. 2 corresponds to the behavior of the chalcogenide material when it has been set. Once set, the material is in its low resistance state and is influenced by the application of power or energy according to the post-setting region shown in right side of FIG. 2. This portion of the electrical resistance response curve may be referred to as the analog, multistate or greyscale region of the curve. The application of energy to a material in a greyscale state may produce changes in its electrical resistance. The change in electrical resistance is determined by the amount of energy applied and the rate at which the energy is applied. The rate at which energy is provided corresponds to power and is an important factor in the behavior of a material in the post-setting, greyscale region.

Depending on the power and the state of the chalcogenide material in the greyscale region of FIG. 2, an increase or decrease in electrical resistance may occur. Furthermore, the behavior in the greyscale region is reversible. This reversibility is depicted by the two arrows shown in the greyscale region of FIG. 2 and underlies the direct overwrite feature of the material in the greyscale region. A power and electrical resistance may be associated with each point in the greyscale region. If the applied power exceeds the power associated with the point describing a material in the greyscale region, the electrical resistance of the material increases. Conversely, if the applied power is less than the power associated with the point describing a material in the greyscale region, the electrical resistance decreases.

The reversibility is limited to the greyscale region of FIG. 2. It is not possible to reverse the setting transformation by applying an energy corresponding to a point in the high resistance accumulation region of FIG. 2 that precedes (i.e. is to the left of) the setting transformation. It is possible, however, to restore the high resistance state of the material by applying a sufficiently high power to a material described by a point in the greyscale region of FIG. 2. The application of such power corresponds to moving in the rightward direction in FIG. 2, rather than in the direction of reversing the setting transformation. As shown in the greyscale region of FIG. 2, the application of continually increasing amounts power leads to a continual increase in electrical resistance. Upon application of sufficient power to drive the material to the far right side of FIG. 2, the material returns to its high resistance state and renews its high resistance plateau of accumulation states.

The power or rate of energy needed to transform a chalcogenide material of this embodiment from a greyscale state to a high resistance state may be referred to as the "reset power", "resetting power", "reset energy", "resetting energy" or the like. The low resistance set state corresponds to the greyscale state having the maximum reset energy. The state of the material at the conclusion of the application of the reset energy may be referred to as the "reset state". The application of the reset power "resets" the material to produce a high resistance reset state and places the material in its accumulation region. The behavior observed upon further application of energy after resetting is corresponds to that described hereinabove for the accumulation region of FIG. 2.

The behavior (including switching, memory, accumulation and cognitive operation) and chemical compositions of chalcogenide materials included within the scope of this invention have been described, for example, in the following U.S. Pat. Nos. 6,671,710; 6,714,954; 6,087,674; 5,166,758; 5,296,716; 5,534,711; 5,536,947; 5,596,522; 5,825,046; 5,687,112; 5,912,839; 3,271,591 and 3,530,441, the disclosures of which are hereby incorporated by reference. These references also describe proposed mechanisms that govern the behavior of the electrical and optical chalcogenide materials. The references also describe the structural transformations from the crystalline state to the amorphous state (and vice versa) via a series of partially crystalline states in which the relative proportions of crystalline and amorphous regions vary underlying the operation of electrical and optical chalcogenide materials.

Representative chalcogenide materials are those that include one or more elements from column VI of the periodic table (the chalcogen elements) and optionally one or more chemical modifiers from columns III. IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking.

Suitable deposition precursors for the instant invention include gas or vapor phase molecular compounds comprising a chalcogen element or liquid or solid phase compounds that are capable of being converted to a gas or vapor phase through, for example, evaporation or sublimation. Representative precursors include alkyl compounds of chalcogen elements, chalcogen compounds including a chalcogen-carbon bond, amine compounds of chalcogen elements, and chalcogen compounds including a chalcogen-nitrogen bond. Specific representative illustrations are provided in further detail in the examples that follow hereinbelow.

Example 1

In this example, the CVD synthesis of $Sb_2Te_3$ on a silicon nitride substrate is demonstrated. The CVD reactor includes a substrate mount, multiple precursor inlets for delivering precursors in vapor or gas phase form directly or diluted in a carrier gas as well as separate overhead showerhead and backfill lines for providing background pressure of an inert ambient gas.

Figure 3:
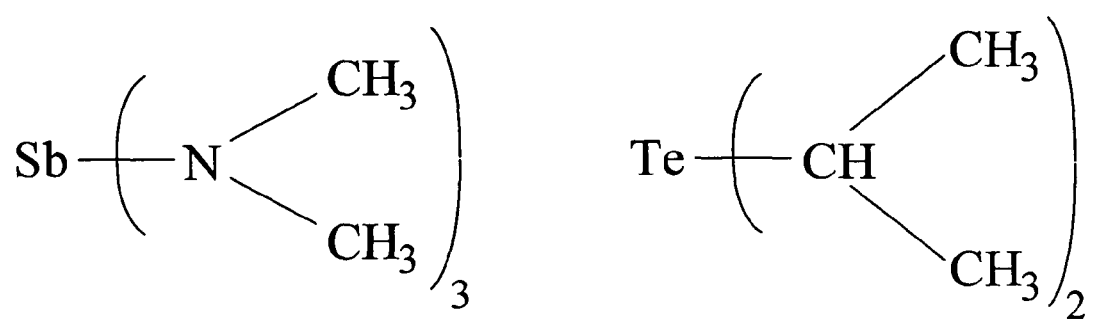
FIG. 3. Schematic molecular depictions of an Sb precursor and a Te precursor suitable for CVD deposition of chalcogenide materials.

A silicon nitride wafer substrate was placed in a CVD reaction chamber. Tris(dimethylamino)antimony ($Sb(N(CH_3)_2)_3$) was used as the antimony (Sb) precursor to provide the Sb necessary for film formation. Diisopropyltellurium ($Te(CH(CH_3)_2)_2$) was used as the tellurium (Te) precursor to provide the Te necessary for film formation. The molecular forms of the two precursors are shown in FIG. 3 herein. Both precursors are liquids at ambient condition and were delivered to the CVD reactor in a vapor phase form through use of a bubbler. The Sb-precursor and the Te-precursor were placed in separate bubblers connected through separate lines to the CVD reactor. Each bubbler and its delivery lines were heated to 75° C. $N_2$ was used as a carrier gas for delivering each of the precursors to the CVD reactor. $N_2$ was bubbled through each bubbler at a flow rate of 300 sccm to produce a gas stream containing each precursor in a vapor phase form diluted in $N_2$, which serves as a carrier gas. Each of these gas streams was further diluted in another 200 sccm of $N_2$ and then introduced into the CVD reactor to undergo a film formation reaction. During the deposition, 250 sccm of $N_2$ was delivered from the showerhead from above the substrate and 250 sccm of $N_2$ was delivered from below the substrate through the backfill line. The total pressure in the CVD reactor during deposition was approximately 3 Torr.

The substrate was heated to 350° C. and was rotated at 50 rpm during the CVD reaction. Rotation of the substrate promotes uniformity of deposition across the substrate. The reaction was permitted to run for ~30 minutes and on conclusion of the reaction, a film of about 3000 Å in thickness had been prepared on the substrate.

Figure 4:
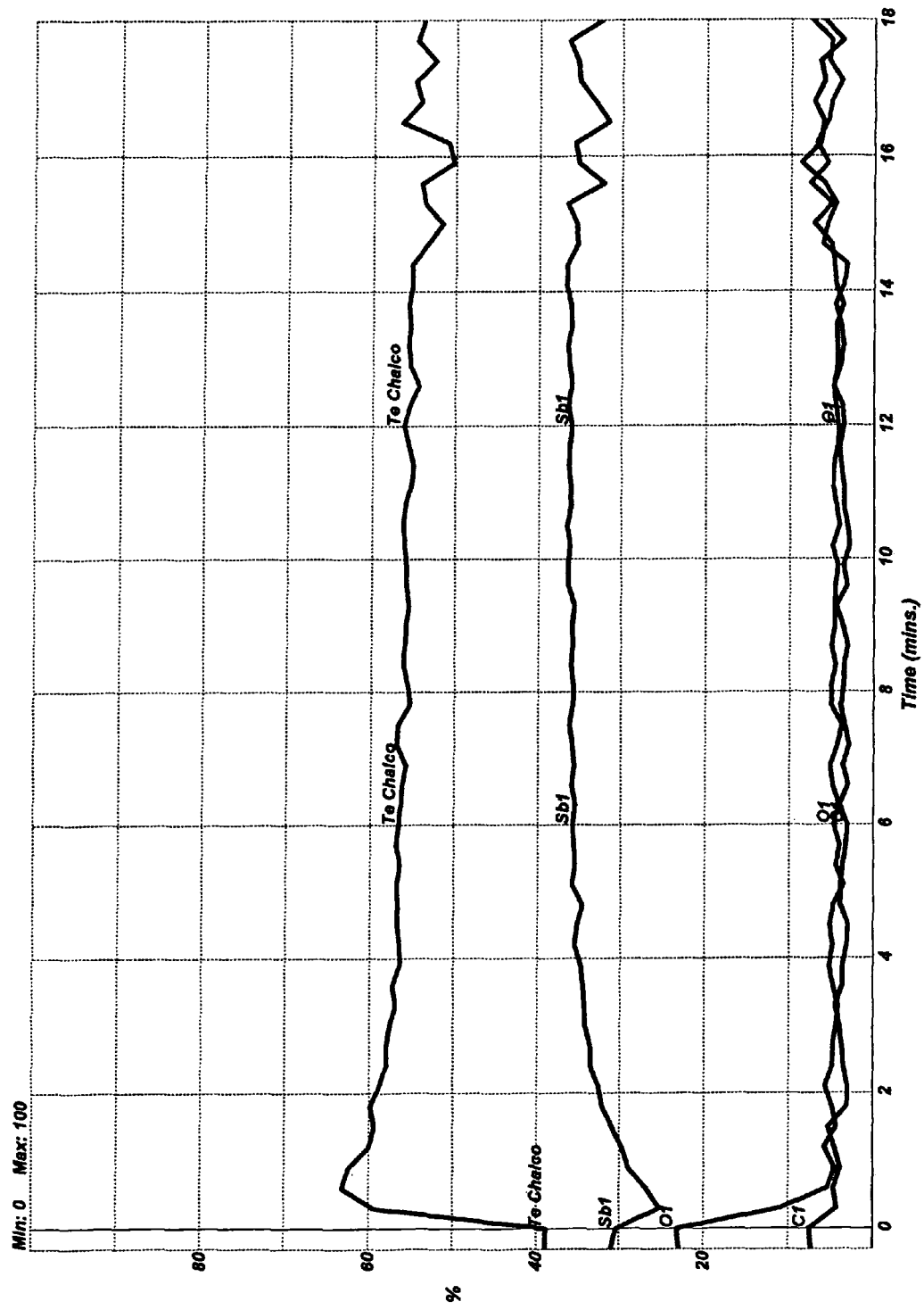
FIG. 4. Depth profile obtained from Auger emission spectroscopy of a CVD-deposited $Sb_2Te_3$ thin film.

The film was analyzed using Auger emission spectroscopy. The results of Auger depth profiling are shown in FIG. 4 herein. The Auger analysis confirmed the presence of Sb and Te in the deposited film and further showed that the Sb:Te atomic ratio was approximately 36:56 or 2:3.1, which is in agreement with the expected ratio for $Sb_2Te_3$. The depth profiling further shows the uniformity of the composition of the film in the thickness direction. This indicates that a uniform binary film was deposited instead of separate layers or regions of Sb and Te.

Figure 5:
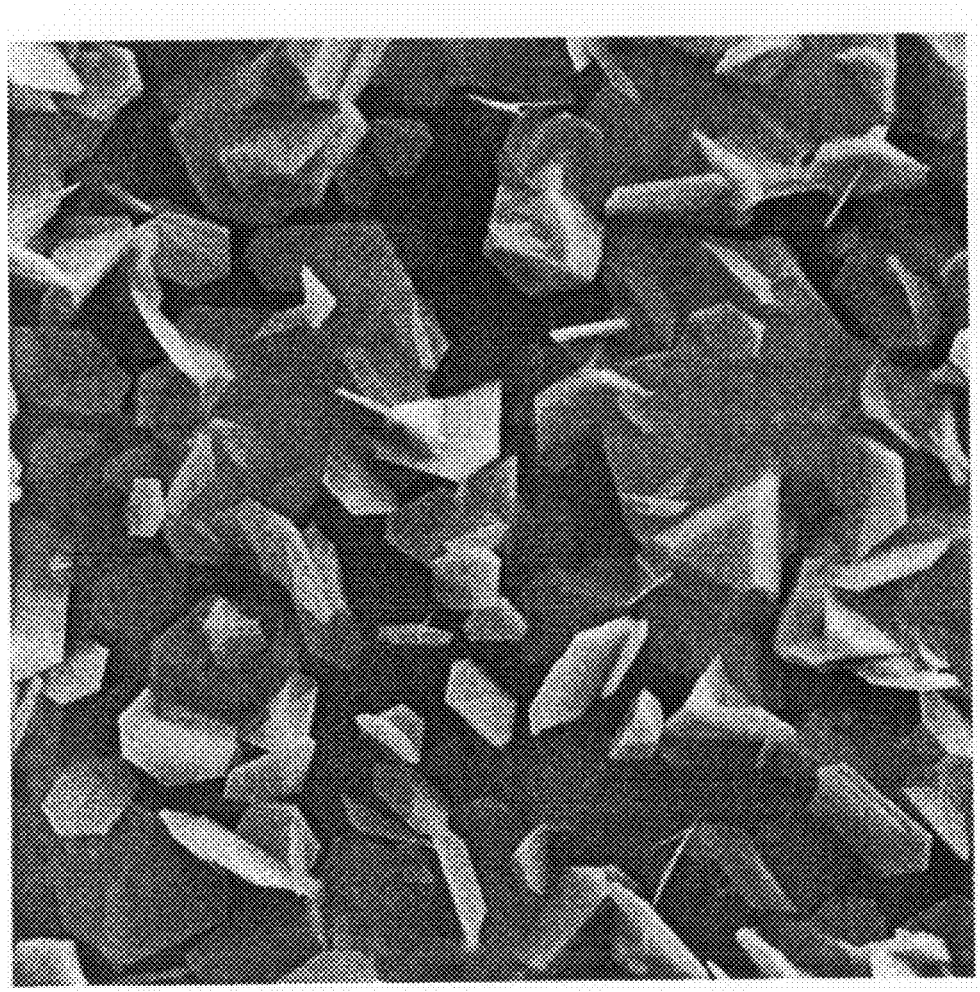
FIG. 5. Scanning electron micrograph of a CVD-deposited $Sb_2Te_3$ thin film.

FIG. 5 herein shows a scanning electron micrograph of a portion of the deposited film. The micrograph was obtained at a magnification of 4000×. The micrograph indicates that the deposited film is polycrystalline in nature. A typical grain size in the film is on the order of microns.

Example 2

Figure 6:
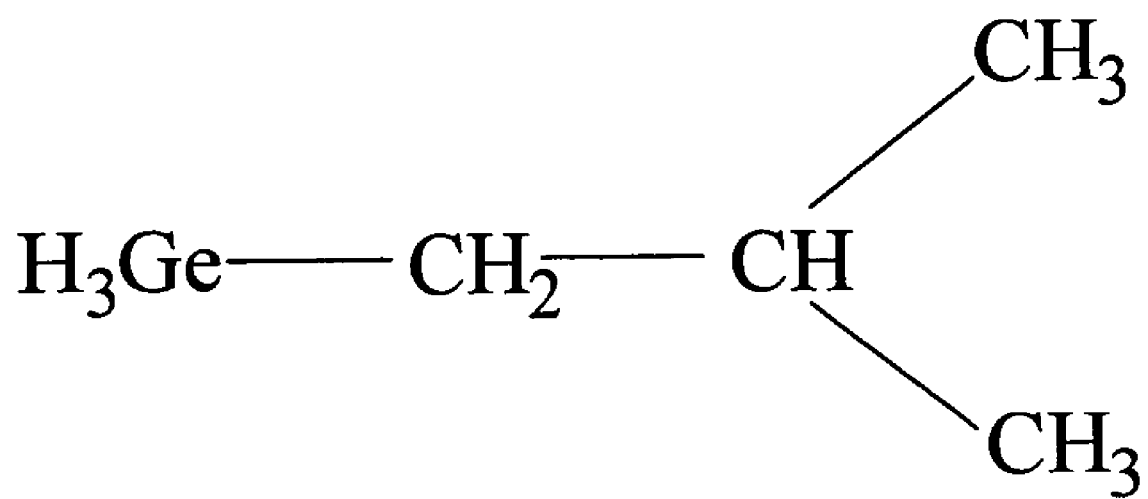
FIG. 6. Schematic molecular depictions of a Ge precursor suitable for CVD deposition of chalcogenide materials.

In this example, a two layer structure including solid phase layers of $Sb_2Te_3$ and Ge is prepared in a CVD process. The deposition was performed on a SiN substrate that was rotated at 50 rpm. The CVD reactor, the Sb-precursor and Te-precursor used in this example are as described in EXAMPLE 1 hereinabove. The Ge-precursor was isobutylgermane, $H_3Ge$ ($i$-$C_4H_9$), and has the molecular form shown in FIG. 6 herein. The Ge-precursor is a high vapor pressure liquid at ambient conditions and was delivered to the CVD reactor through a bubbler.

The deposition began with deposition of a Ge layer. The Ge-precursor was placed in a bubbler. 200 sccm of He was bubbled through the Ge-precursor to provide a gas stream containing the Ge-precursor in a vapor phase form in He as a carrier gas. This gas stream was further diluted with 300 sccm of He and then injected into the reactor. During deposition of the Ge layer, 400 sccm He was injected through the showerhead and 250 sccm He was injected through the backfill line. The reactor pressure during deposition of the Ge layer was approximately 6 Torr and the substrate temperature was approximately 400° C. The deposition was allowed to proceed for 15 minutes and was then terminated. The reactor was purged without removing the substrate containing the Ge layer and readied for deposition of an $Sb_2Te_3$ layer.

The $Sb_2Te_3$ layer was deposited directly onto the Ge layer under conditions as described in EXAMPLE 1 hereinabove. The deposition was permitted to run for 25 minutes and then terminated.

The resulting two-layer structure may be referred to herein as the as-deposited structure, as-deposited multilayer structure, penultimate structure, penultimate multilayer structure, or the like. The penultimate structure subsequently subjected to electrical test measurements. Two electrical probes were placed in contact with the upper $Sb_2Te_3$ layer of the structure and the current-voltage (I-U(V)) and resistance-current (R-I) responses of the two-layer material were measured. The probe tips had a diameter of ~2.5 μm and were separated by a distance of a few hundred microns. In the current-voltage measurements, the current passing between the probes was measured as a function of the voltage applied between the probes. In the resistance-current measurements, current pulses having different amplitudes were applied and the resistance of the sample following termination of the pulse was measured.

Figure 7:
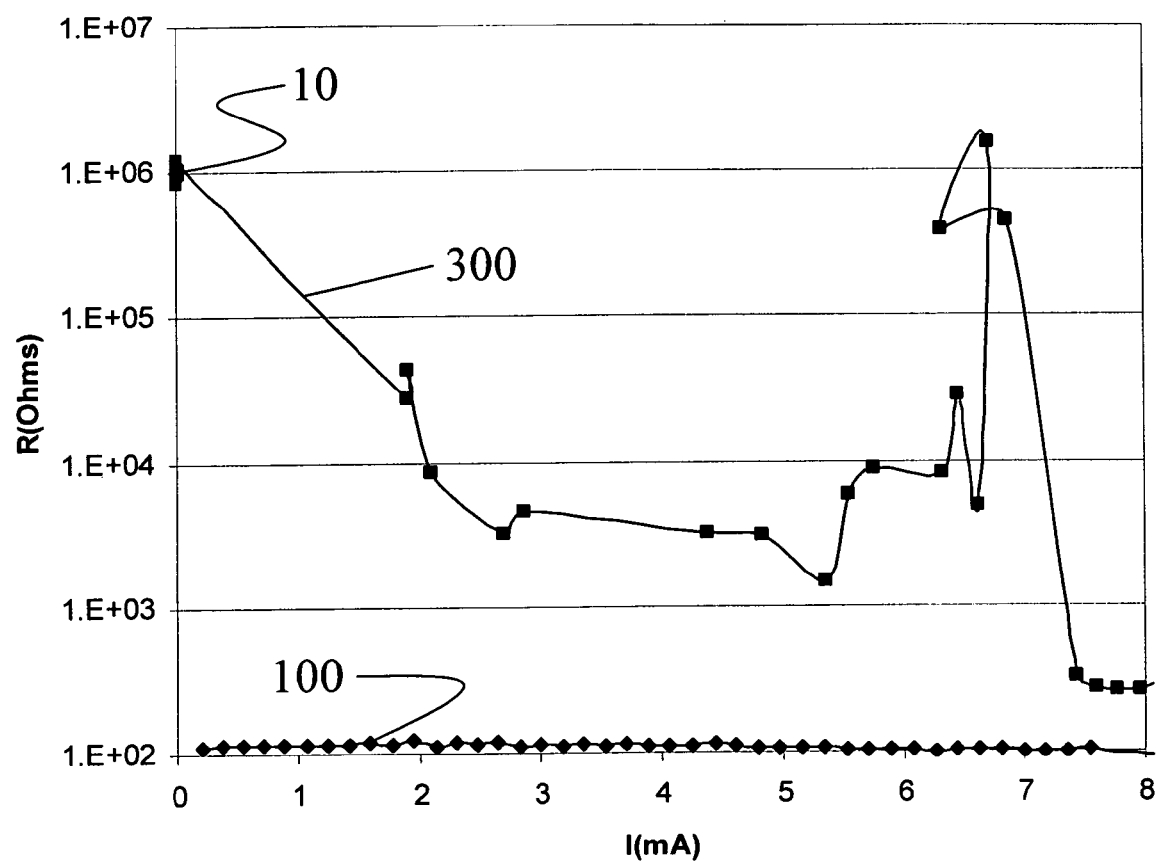
FIG. 7. Resistance as a function of current characteristics of a two-layer CVD deposited thin film structure.
Figure 8:
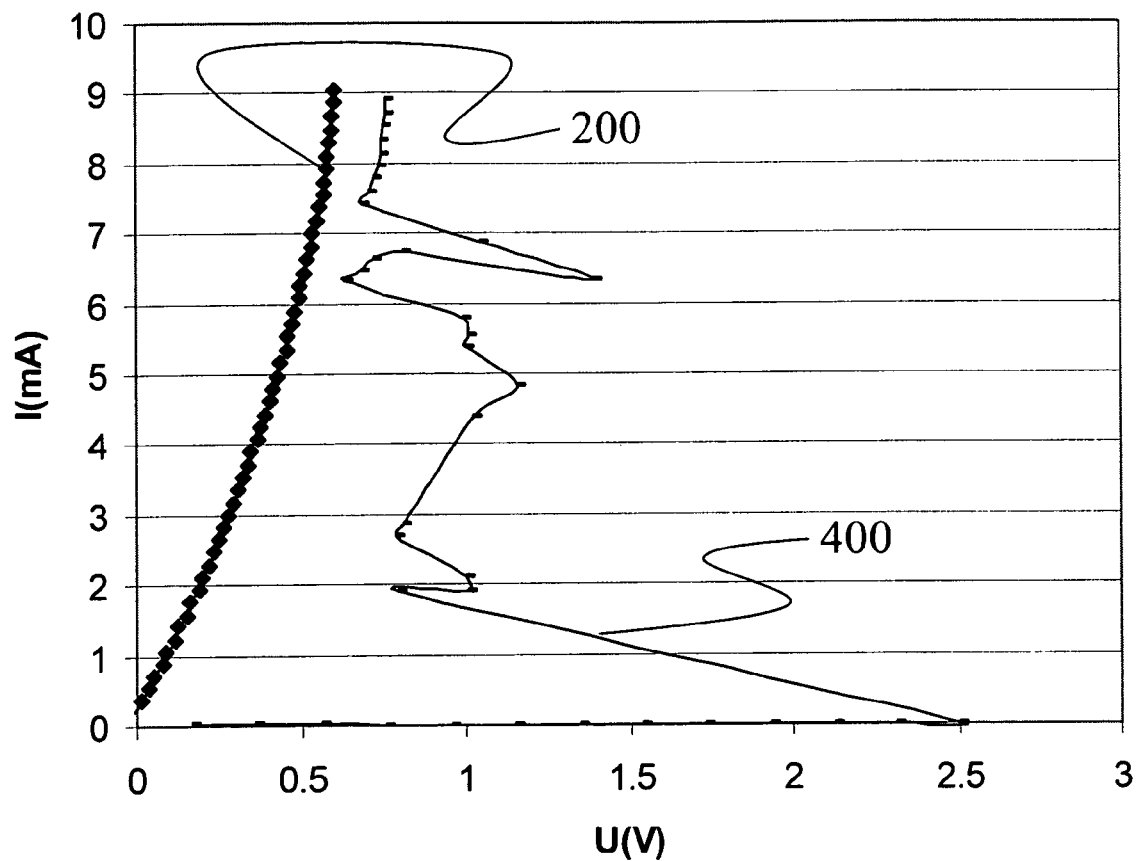
FIG. 8. Current as a function of voltage characteristics of a two-layer CVD deposited thin film structure.

The results of the measurements are summarized in FIGS. 7 and 8 herein. FIG. 7 shows the R-I response and FIG. 8 shows the I-U(V) response of the as-deposited (penultimate) structure. The response of the penultimate structure is given by the set of points collectively labeled 100 in the R-I measurement shown in FIG. 7 and by the set of points collectively labeled 200 in the I-U(V) measurement shown in FIG. 8. The response curve 100 shown in FIG. 7 indicates that the as-deposited (penultimate) structure has a low resistance and undergoes no significant transformation in structure over the range of currents investigated. This behavior is consistent with a crystalline state for the material. The I-U(V) response curve 200 shown in FIG. 8 is also consistent with a crystalline state for the as-deposited (penultimate) structure.

Upon completion of the R-I and I-V measurements of the as-deposited (penultimate) structure, a high amplitude current pulse was applied to the structure to form an ultimate structure. After application of the pulse, the resistance between the electrical probes was measured at low current and was observed to be approximately 1 MΩ ($10^6$Ω). The result of this measurement is indicated by the point 10 in FIG. 7. Following the resistance measurement, the current-voltage characteristics of the ultimate structure were tested. The results of this measurement are shown by the set of points collectively labeled 400 in FIG. 8. The current-voltage response following application of the high amplitude current pulse shows an electrical switching behavior. At low voltages, the response is linear with a small slope that is indicative of a high resistance structure. Upon reaching a voltage of slightly above 2.5V (i.e. upon reaching the threshold voltage of the structure), the structure switches from a high resistance state to a low resistance state as evidenced by the switchback behavior of the current-voltage response curve. The switching transition demonstrated by the set of points 400 in FIG. 8 is analogous to the transition from a resistive regime to a conductive regime as described in U.S. Pat. Appl. Pub. No. 20040178401, the disclosure of which is hereby incorporated by reference herein.

Upon completion of the current-voltage measurement, the resistance-current characteristics of the ultimate structure were measured to examine the effect of the application of the high amplitude current pulse. The results of the measurement are shown by the points collectively labeled 300 in FIG. 7. At low current, the resistance of the structure is about 1 MΩ, as described above. A series of current pulses of progressively higher current amplitude was subsequently applied to the ultimate structure. Application of current pulses up to ~3 mA resulted in a marked decrease in the resistance of the ultimate structure. For current pulses between ~3 mA and ~5 mA, the resistance leveled off at a value in the $10^3$-$10^4$Ω range. Above ~5 mA, the resistance increased and ultimately was restored to its initial value of ~1 MΩ.

The resistance-current behavior depicted by the set of points 300 illustrates the setting and resetting characteristics of the ultimate structure. The decrease in resistance observed for current pulses up to ~3 mA corresponds to the accumulation behavior and setting transformation of chalcogenide materials. The leveling and increase in resistance observed above ~3 mA correspond to the multistate, direct overwrite behavior of chalcogenide materials and attainment of a resistance comparable to the initial resistance corresponds to the resetting transformation of a chalcogenide material. The energy accumulation capability, set transformation, multistate regime and reset transformation are described, for example, in U.S. Pat. Nos. 5,912,839; 6,141,241; 6,714,954; and 6,671,710; the disclosures of which are hereby incorporated by reference herein.

While not wishing to be bound by theory, the instant inventors believe that application of a high current amplitude pulse to the as-deposited (penultimate) structure induces a diffusion or interdiffusion of elements between the individual layers such that a three-element chalcogenide composition is formed in the ultimate structure, where the three-element composition is one that exhibits electrical switching upon application of a threshold voltage. The ultimate structure may additionally exhibit accumulation, setting and resetting characteristics. The instant inventors believe that a three-element composition is formed through the post-deposition application of energy, such that the electrical switching characteristics analogous to that shown by the set of points 400 in FIG. 8 and accumulation, setting and resetting characteristics analogous to those shown by the set of points 300 in FIG. 7 for the ultimate structure are induced.

Figure 9:
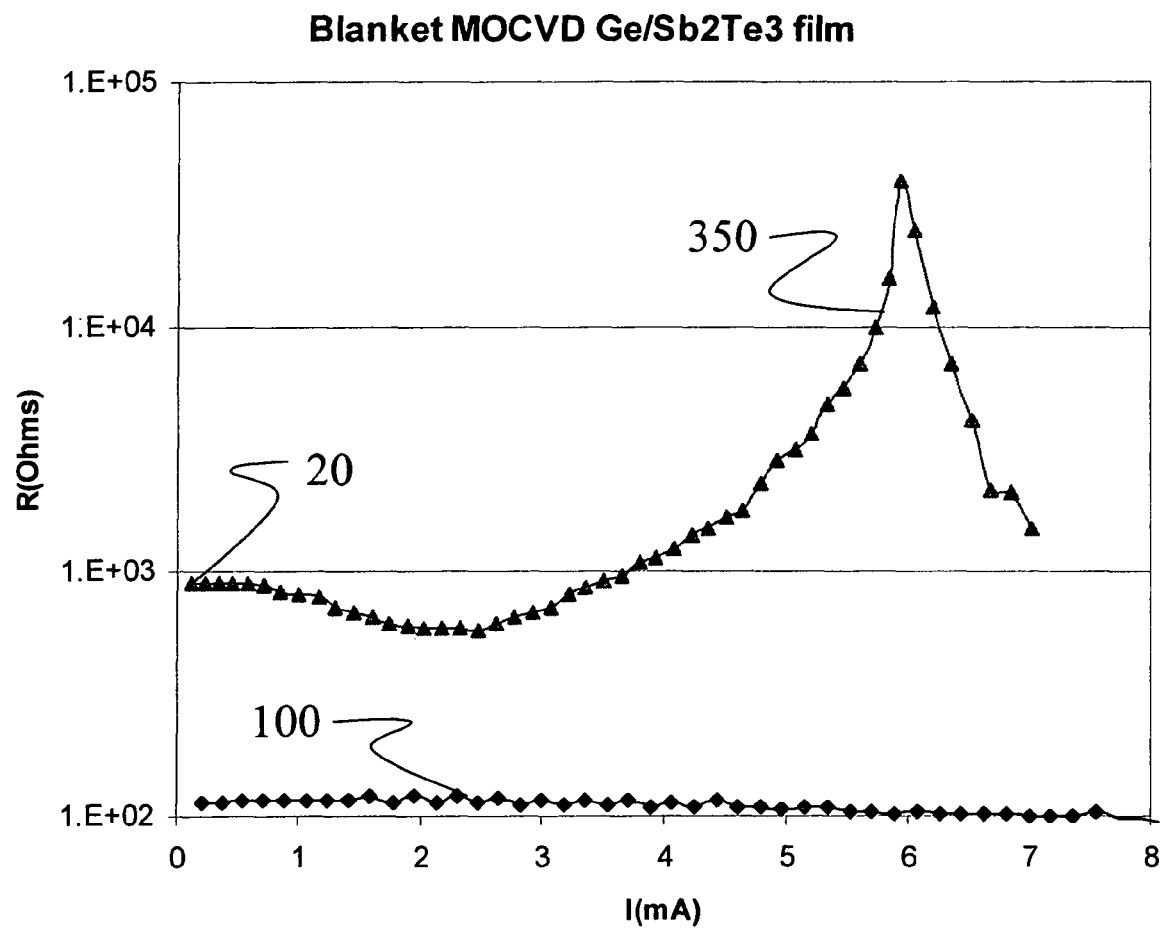
FIG. 9. Resistance as a function of current characteristics of a two-layer CVD deposited thin film structure.

FIG. 9 shows a further measurement, depicted by the set of points collectively labeled 350, of the resistance-current characteristics of the ultimate structure. The lower set of points collectively labeled 100 duplicates the points labeled 100 in FIG. 7. The initial state 20 of the structure for this measurement differed from the initial state 10 of the experiment shown in FIG. 7. Specifically, the initial resistance was about a factor of 1000 smaller for the experiment of FIG. 9 than for the experiment of FIG. 7. As can be seen in FIG. 9, accumulation, setting, reversible multistate, and resetting characteristics are exhibited by the structure. The lower initial resistance leads to a smaller decrease in resistance upon setting. Such behavior is consistent with the expected behavior of the cognitive chalcogenide materials discussed in the prior art. The reversible multistate region extends from about 2 mA up to the reset state (~5.8 mA). The reversible multistate region includes a plurality of states distinguishable based on resistance. The range of resistances within the plurality exceeds a factor of 10.

This example thus demonstrates that post-deposition application of a high amplitude current pulse is capable of transforming an as-deposited penultimate multilayer structure that shows no electrical switching, accumulation, setting and/or resetting characteristics in its as-deposited form into an ultimate structure which shows one or more of such characteristics.

Example 3

In this example, a single layer three-element solid phase chalcogenide thin film is deposited by chemical vapor deposition. The deposition was performed on a SiN substrate that was rotated at 50 rpm. The CVD reactor, the Sb-precursor, Te-precursor and Ge-precursor used in this example are as described in EXAMPLE 1 and EXAMPLE 2 hereinabove.

The deposition in this example was accomplished through a reaction of the Sb-precursor, Te-precursor, and Ge-precursor, where all three precursors were present simultaneously in the CVD reactor. The precursors were introduced into the CVD reactor through separate feed lines. Helium (He) was used as a carrier gas for all three precursors. The Sb-precursor and Te-precursor were placed in separate bubblers heated to 75° C. and delivered to the CVD reactor through separate feed lines, also heated to 75° C. He was bubbled through the Sb-precursor bubbler at a flow rate of 200 sccm to produce a gas stream containing the Sb-precursor in a vapor phase form diluted in He, which serves as a carrier gas. This gas stream was further diluted in another 100 sccm of He and then introduced into the CVD reactor to provide the Sb-precursor in a vapor phase form to the film formation reaction. He was bubbled through the Te-precursor bubbler at a flow rate of 200 sccm to produce a gas stream containing the Te-precursor in a vapor phase form diluted in He, which serves as a carrier gas. This gas stream was further diluted in another 100 sccm of He and then introduced into the CVD reactor to provide the Te-precursor in a vapor phase form to the film formation reaction. The Ge-precursor was placed in a separate bubbler. 200 sccm of He was bubbled through the Ge-precursor bubbler to provide a gas stream containing the Ge-precursor in a vapor phase form in He as a carrier gas. This gas stream was further diluted with 300 sccm of He and then injected into the CVD reactor to provide the Ge-precursor in a vapor phase form to the film formation reaction.

During the deposition, 400 sccm of He was delivered from the showerhead from above the substrate and 250 sccm of He was delivered from below the substrate through the backfill line. The total pressure in the CVD reactor during deposition was approximately 6 Torr. The substrate was heated to 400° C. during the CVD reaction. The reaction was permitted to run for ~15 minutes and on conclusion of the reaction, a film of about 3000 Å in thickness had been prepared on the substrate.

Figure 10:
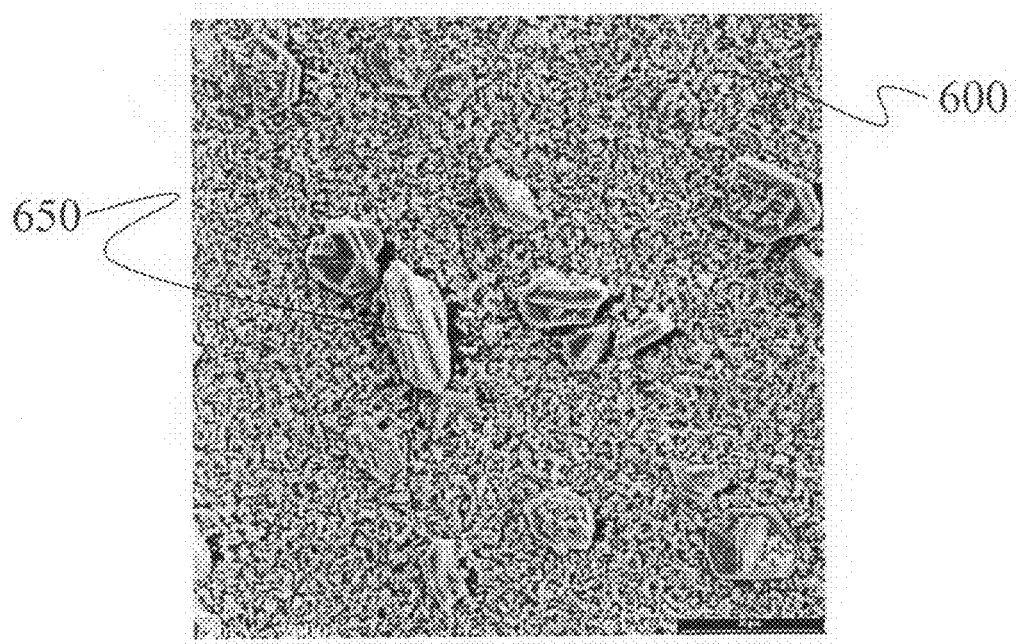
FIG. 10. Low magnification (2000×) image of a Ge—Sb—Te ternary chalcogenide material deposited by CVD.
Figure 11:
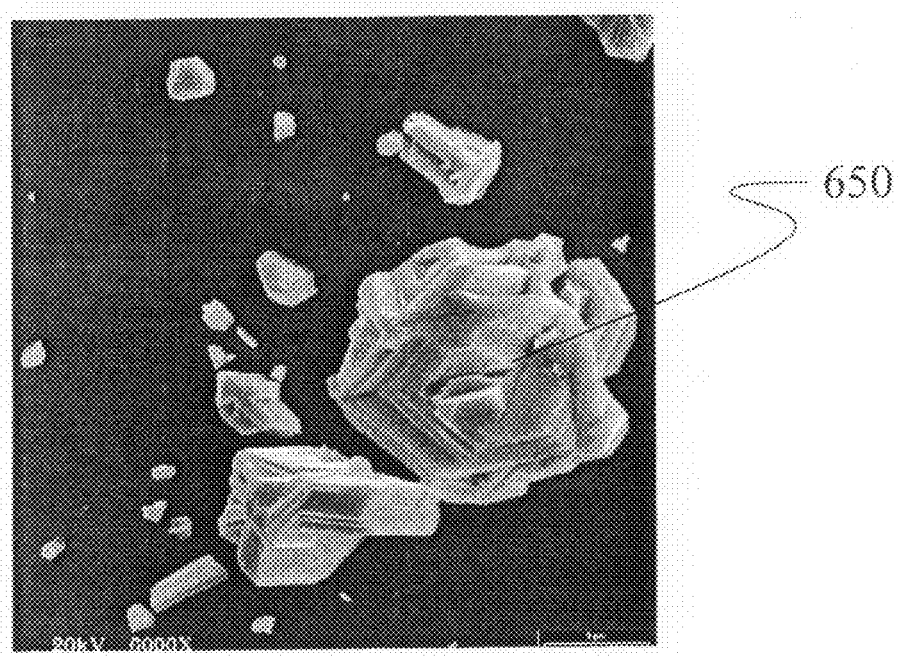
FIG. 11. High magnification (6000×) image of a Ge—Sb—Te ternary chalcogenide material deposited by CVD.

A scanning electron microscopy analysis of the film was completed and selected results are presented in FIG. 10 and FIG. 11. FIG. 10 is a low magnification (2000×) image of the film and shows several larger crystallites 650 in the presence of a finer grain background material 600. FIG. 11 shows a high magnification image (6000×) of one of the larger crystallites 650. Elemental analysis of the background material 600 and crystallites 650 were completed using EDS. The EDS results indicated that the ratio of Ge:Sb:Te in the background material 600 was 1:2:3, thus indicating a stoichiometric $GeSb_2Te_3$ composition. The EDS results indicated that the ratio of Ge:Sb:Te in the crystallites 650 was 2:2:5, thus indicating a stoichiometric $Ge_2Sb_2Te_5$ composition.

Figure 12:
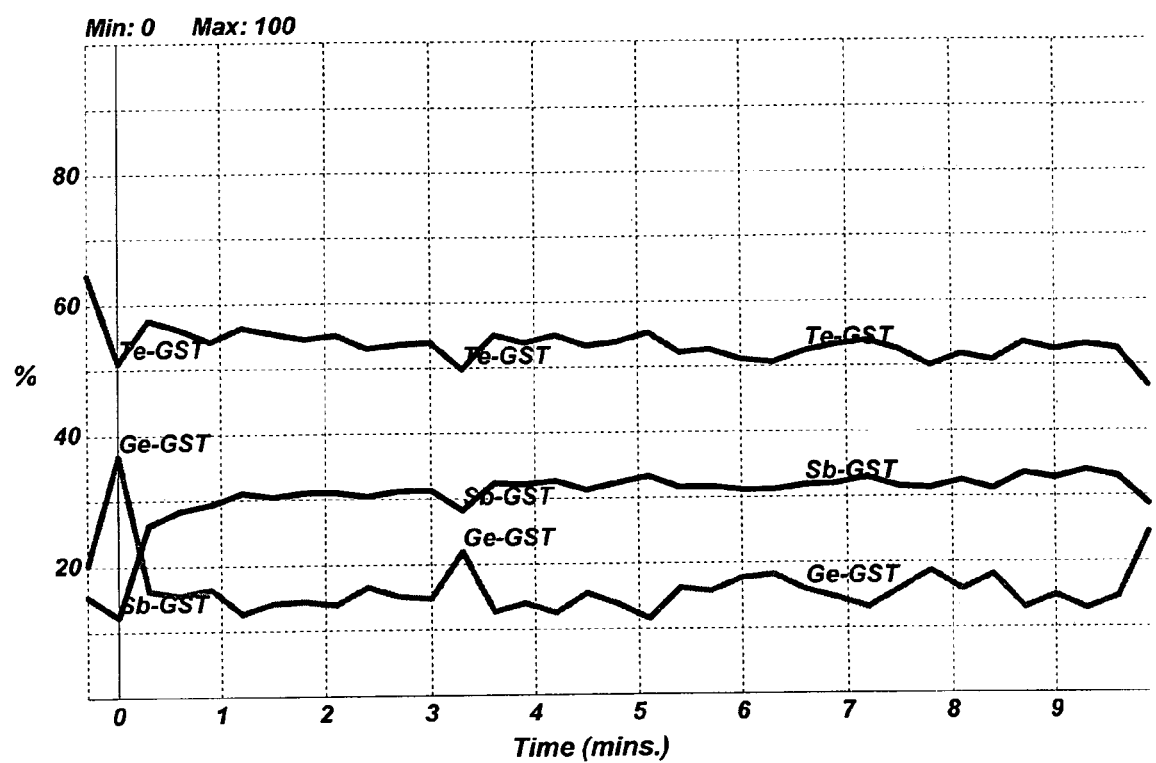
FIG. 12. Depth profile obtained from Auger emission spectroscopy of a CVD-deposited ternary Ge—Sb—Te thin film.

The film was further analyzed using Auger emission depth profiling and representative results are shown in FIG. 12 herein. The Auger analysis confirmed the presence of Ge, Sb and Te in the film and further showed that Ge, Sb and Te atomic compositions were fairly uniform with some fluctuation in the depth direction. This result confirms the formation of a ternary composition throughout the thin film, rather than multiple binary or single element regions, layers or domains.

The ternary chalcogenide film was subsequently subjected to electrical test measurements. Two electrical probes were placed in contact with the film and the current-voltage (I-U (V)) and resistance-current (R-I) responses of the film were measured as described in EXAMPLE 2 hereinabove. The current-voltage results show electrical switching similar to that described in EXAMPLE 2 hereinabove with a threshold voltage above 2V.

Figure 13:
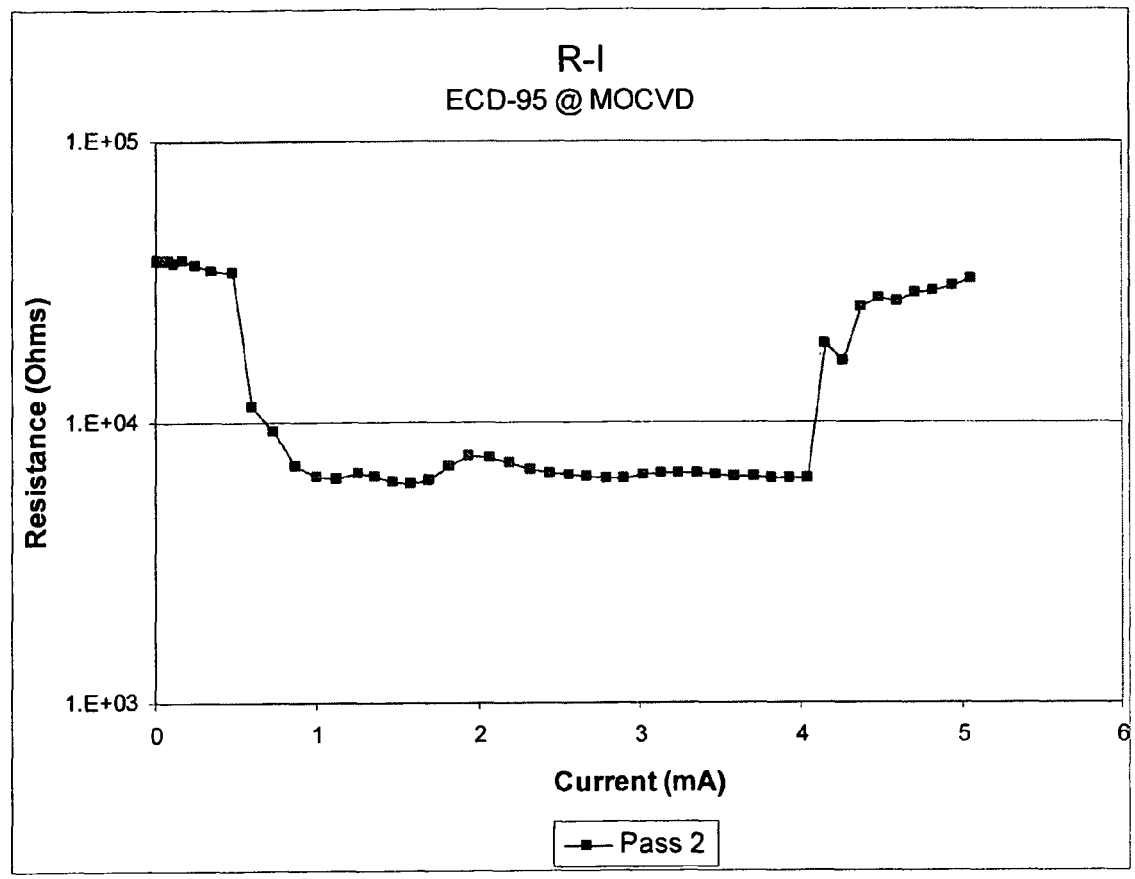
FIG. 13. Resistance as a function of current characteristics of a CVD-deposited ternary Ge—Sb—Te thin film.

The resistance-current results are shown in FIG. 13. Current pulses of ~500 ns were used in this experiment. The ternary chalcogenide film exhibited a high initial resistance and displayed a high resistance plateau upon application of current pulses have amplitudes up to about 0.5 mA. The behavior observed in the high resistance plateau corresponds to the accumulative or cognitive functionality described in EXAMPLE 2 hereinabove. In the current pulse amplitude region between about 0.5 mA and about 1 mA, the film exhibited a sharp decrease in resistance, behavior that corresponds to the setting transformation of the ternary chalcogenide film as described in EXAMPLE 2 hereinabove. In the current pulse amplitude region between about 1 mA and about 4 mA, the resistance leveled. Above about 4 mA, a sharp increase in the resistance of the film was observed, behavior that corresponds to a resetting of the film as described in EXAMPLE 2 hereinabove. The resistance-current characteristics shown in FIG. 13 were reproducible upon repeated performance of the experiment.

This resistance-current results of FIG. 13 show that the ternary chalcogenide thin film formed through the chemical vapor deposition process of this example has a series of states, which may be characterized according to resistance. Each of the data points shown in FIG. 13 corresponds to representative states of the chalcogenide thin film and a resistance value can be associated with each state. The states include a plurality of states having distinguishable resistances. The resistances of the states within the plurality differ by a factor of up to eight.

The electrical measurement results show that the ternary chalcogenide material formed in this experiment displays the electrical switching, cognitive, accumulation, setting, resetting and multistate memory functionality described in the patents incorporated by reference herein.

Example 4

In this example, a single layer two-element (GeTe) solid phase chalcogenide thin film is deposited by chemical vapor deposition. The deposition was performed on a SiN substrate that was rotated at 75 rpm. The CVD reactor, Te-precursor and Ge-precursor used in this example are as described in EXAMPLE 1, EXAMPLE 2 and EXAMPLE 3 hereinabove.

The deposition in this example was accomplished through a reaction of the Te-precursor and the Ge-precursor, where both precursors were present simultaneously in the CVD reactor. The precursors were introduced into the CVD reactor through separate feed lines. Helium (He) was used as a carrier gas for both precursors. The Te-precursor was placed in a bubbler heated to 75° C. and delivered to the CVD reactor through separate feed lines, also heated to 75° C. He was bubbled through the Te-precursor bubbler at a flow rate of 100 sccm to produce a gas stream containing the Te-precursor in a vapor phase form diluted in He, which serves as a carrier gas. This gas stream was further diluted in another 50 sccm of He and then introduced into the CVD reactor to provide the Te-precursor in a vapor phase form to the film formation reaction. The Ge-precursor was placed in a separate bubbler. 100 sccm of He was bubbled through the Ge-precursor bubbler to provide a gas stream containing the Ge-precursor in a vapor phase form in He as a carrier gas. This gas stream was further diluted with 150 sccm of He and then injected into the CVD reactor to provide the Ge-precursor in a vapor phase form to the film formation reaction.

During the deposition, 500 sccm of $N_2$ was delivered from the showerhead from above the substrate and 250 sccm of $N_2$ was delivered from below the substrate through the backfill line. The substrate was heated to 400° C. during the CVD reaction. The reaction was permitted to run for ~15 minutes and on conclusion of the reaction, a film with an estimated thickness of about 1000-2000 Å had been formed on the substrate.

Figure 14:
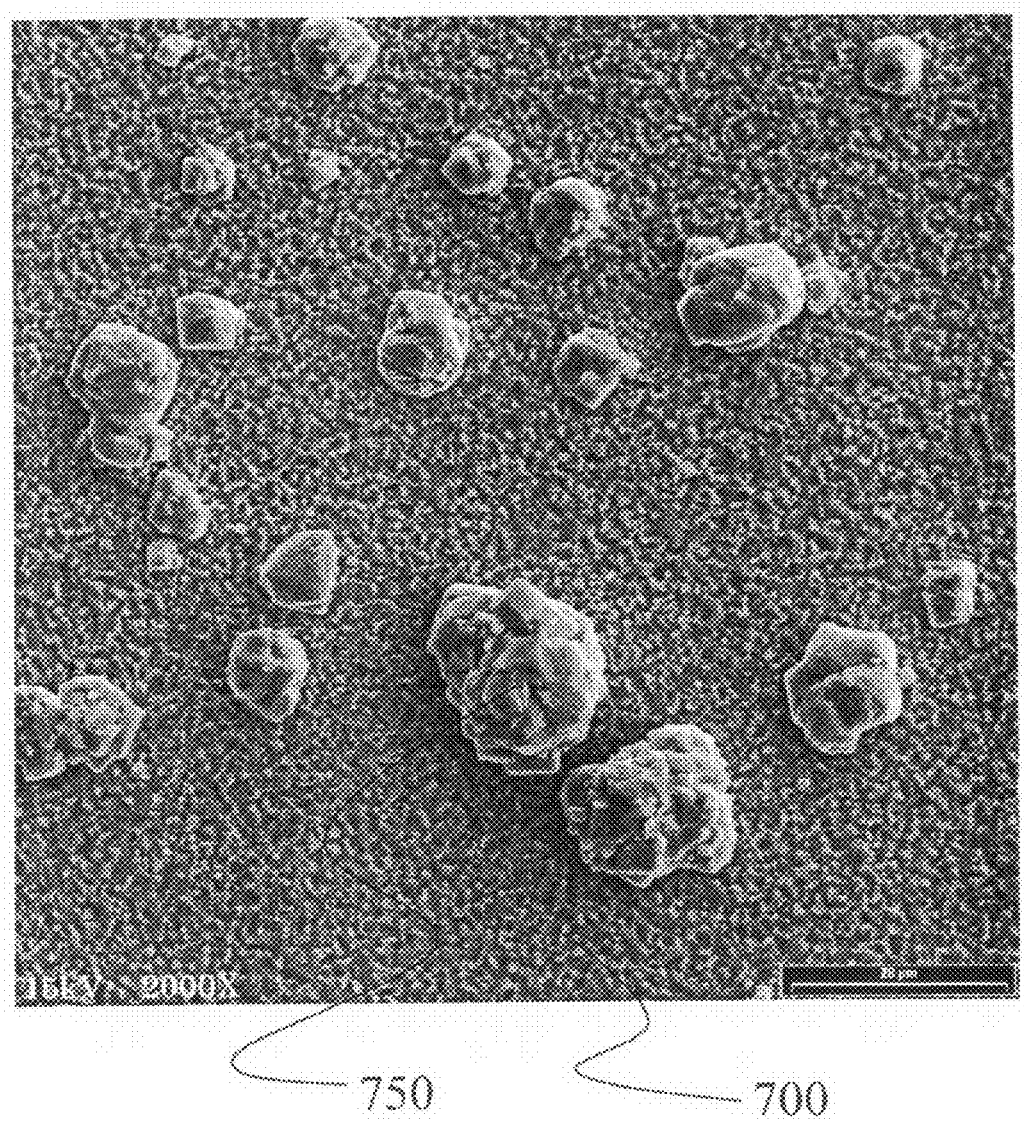
FIG. 14. Low magnification (2000×) image of a Ge—Te binary chalcogenide material deposited by CVD.

A scanning electron microscopy analysis of the film was completed and a selected result is presented in FIG. 14. FIG. 14 is a 2000× image of the film and shows several larger crystallites 750 in the presence of a finer grain background material 700. Elemental analysis of the background material 700 and crystallites 750 were completed using EDS. The EDS results indicated that the ratio of Ge:Te in the background material 700 was approximately 1:1, thus indicating a stoichiometric GeTe composition. The EDS results indicated that the ratio of Ge:Te in the crystallites 750 was also approximately 1:1, thus indicating a stoichiometric GeTe composition.

The film was further analyzed using Auger emission depth profiling. The Auger analysis confirmed the presence of Ge and Te in the film and further showed that the Ge and Te atomic compositions were uniform in the depth direction. This result confirms the formation of a binary GeTe composition throughout the thin film.

The GeTe chalcogenide film was subsequently subjected to electrical test measurements. Two electrical probes were placed in contact with the film and the current-voltage (I-U (V)) and resistance-current (R-I) responses of the film were measured as described in EXAMPLE 2 hereinabove.

Figure 15:
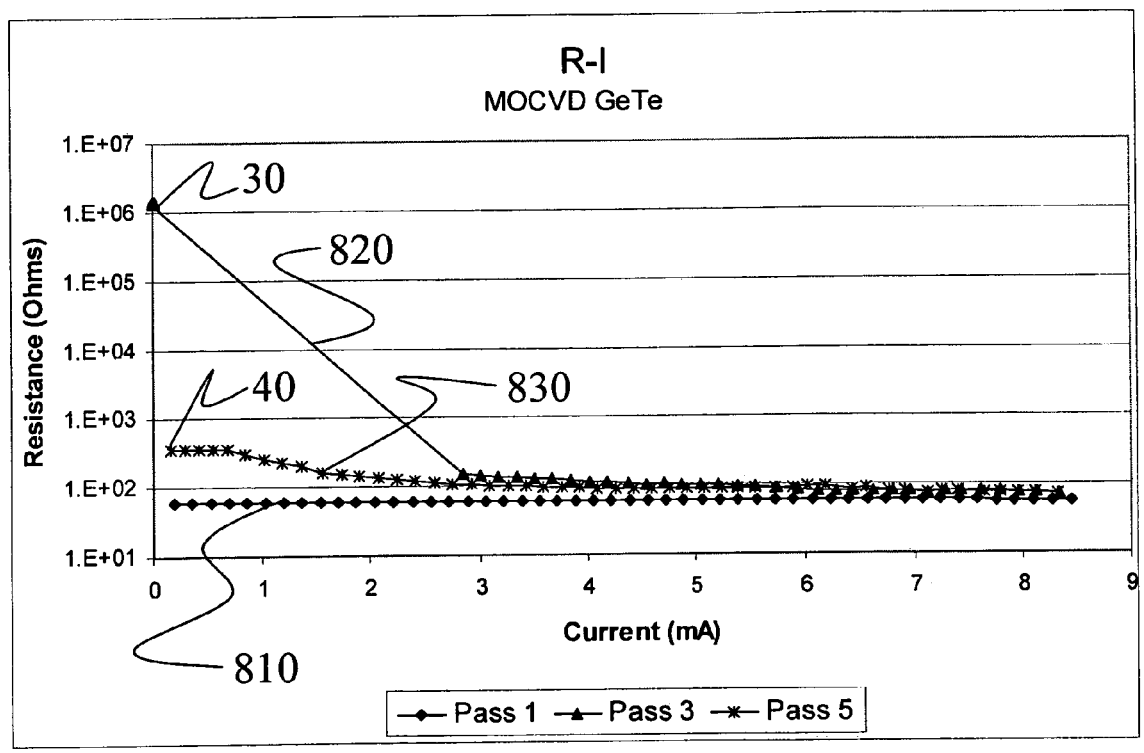
FIG. 15. Resistance as a function of current characteristics of a Ge—Te binary chalcogenide material deposited by CVD.
Figure 16:
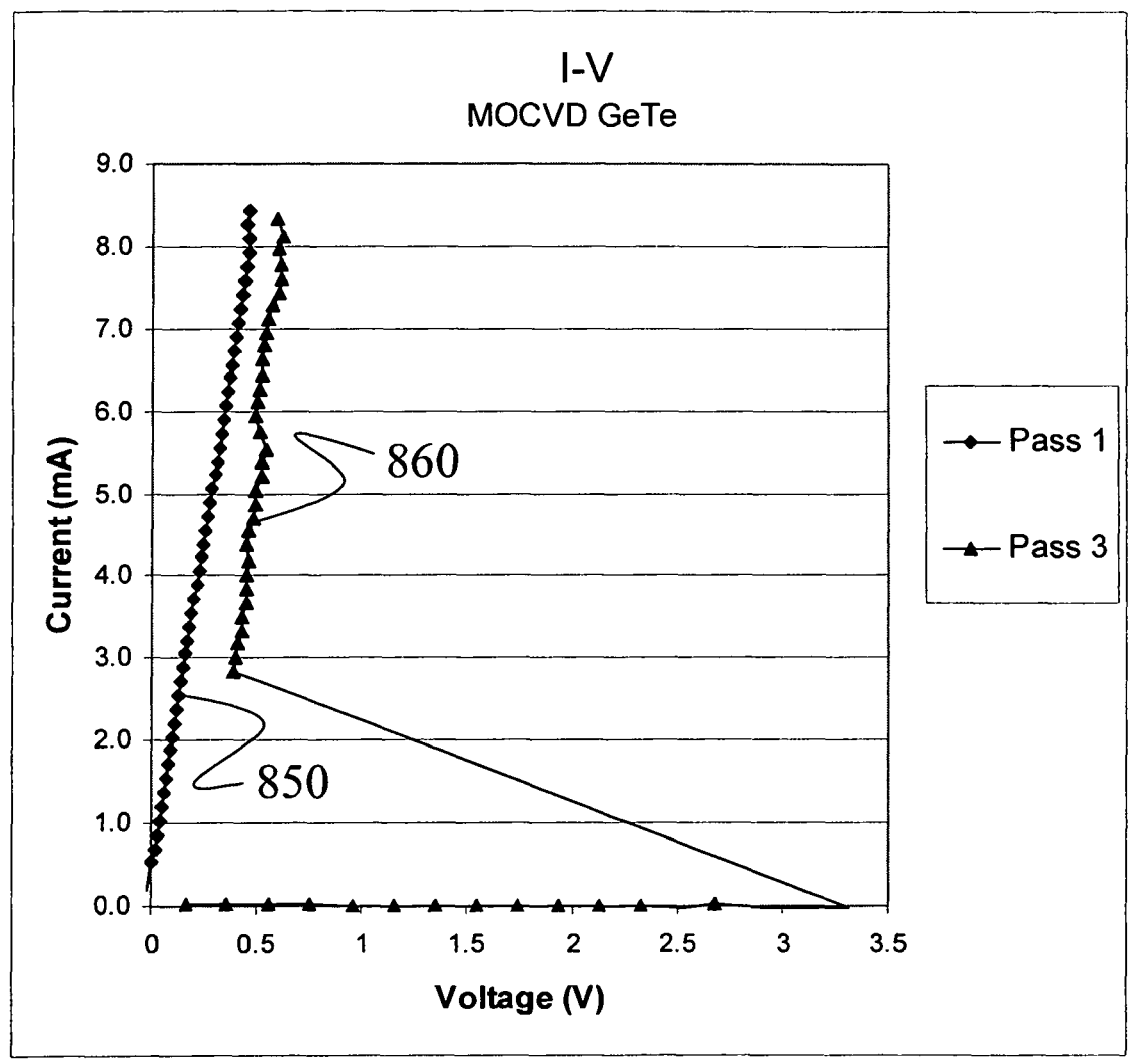
FIG. 16. Current as a function of voltage characteristics of a Ge—Te binary chalcogenide material deposited by CVD.

The results of the measurements are summarized in FIGS. 15 and 16 herein. FIG. 15 shows the R-I response and FIG. 16 shows the I-U(V) response of the GeTe film. The response of the as-deposited GeTe film is given by the set of points collectively labeled 810 in the R-I measurement shown in FIG. 15 and by the set of points collectively labeled 850 in the I-U(V) measurement shown in FIG. 16. The response curve 810 shown in FIG. 15 indicates that the as-deposited GeTe film has a low resistance and undergoes no significant transformation in structure over the range of currents investigated. This behavior is consistent with a crystalline state for the as-deposited material. The I-U(V) response curve 850 shown in FIG. 16 is also consistent with a crystalline state for the as-deposited material.

Upon completion of the R-I and I-V measurements of the as-deposited film, a high amplitude current pulse (~40 mA applied for ~1 μs) was applied between the probe tips to induce amorphization and to establish an initial state for subsequent measurements. A similar procedure was used to establish various initial states in the examples described hereinabove. After application of the pulse, the resistance between the electrical probes was measured at low current and was observed to be approximately 1 MΩ ($10^6$Ω). The result of this measurement is indicated by the point 30 in FIG. 15. Following the resistance measurement, the current-voltage characteristics of the GeTe material were tested. The results of this measurement are shown by the set of points collectively labeled 860 in FIG. 16. The current-voltage response following application of the high amplitude current pulse shows an electrical switching behavior. At low voltages, the response is linear with a small slope that is indicative of a high resistance material. Upon reaching a voltage of about 3.25 V (a voltage corresponding to the threshold voltage of the material), the GeTe material switches from a high resistance state to a low resistance state as evidenced by the switchback behavior of the current-voltage response curve. The switching transition demonstrated by the set of points 860 in FIG. 16 is analogous to the transition from a resistive regime to a conductive regime as described in EXAMPLE 2 hereinabove.

Upon completion of the current-voltage measurement, the resistance-current characteristics of the GeTe material were measured to examine the effect of the amorphizing pulse on these characteristics. The results of the measurement are shown by the points collectively labeled 820 in FIG. 15. At low current, the resistance of the structure is about 1 MΩ and corresponds to the point labeled 30, as described above. A series of current pulses of progressively higher current amplitude was subsequently applied. Application of a current pulse of close to ~3 mA resulted in a marked decrease in the resistance of the GeTe film and demonstrates the accumulation, cognitive, and setting functionality of the film. The points collectively labeled 830 in FIG. 15 show the results of another resistance-current measurement in which the initial state of the GeTe film was adjusted through use of a current pulse to provide the state indicated at 40 in FIG. 15. A series of additional current pulses of increasingly higher amplitude were applied to the material in small incremental steps to map out the variation of resistance with current. The points 830 show a high resistance plateau for current amplitudes up to about 0.75 mA, followed by a transformation region and leveling of resistance above about 0.75 mA. These data also demonstrate the accumulative, cognitive and setting functionality of the GeTe film.

The instant invention extends generally to the chemical vapor deposition of chalcogenide thin films exhibiting electrical switching, accumulation, setting, resetting and/or memory functionality as described hereinabove. In one embodiment, the deposition occurs on a stationary substrate. In another embodiment, the deposition occurs on a moving substrate, such as a continuous web substrate, discrete substrates positioned on a moving conveyor or other transported substrates. The latter embodiment provides for the continuous deposition of a chalcogenide material according to the chemical vapor deposition process of the instant invention. The deposition chamber in the embodiment which includes a moving substrate includes a substrate inlet port into which the substrate is fed. The deposition chamber further includes means for delivering deposition precursors and the rate of delivery of deposition precursors and rate of transportation of the moving substrate are optimized to insure adequate residence time of the substrate in the growth environment of the chamber to insure deposition of a chalcogenide thin film. The deposition chamber further includes a substrate outlet port out of which the substrate, now containing the deposited thin film, is withdrawn. Deposition onto a moving substrate can occur through the formation of a multilayer structure as described in EXAMPLE 2 hereinabove or through the simultaneous introduction of multiple deposition precursors to form a single layer, multielement chalcogenide thin film as described in EXAMPLE 3 and EXAMPLE 4 hereinabove. The scope of this embodiment includes deposition onto a substrate that is continuously in motion during deposition as well as deposition onto substrates that are stationary during deposition, but which are transported sequentially into the deposition chamber for deposition in, for example, a "start-stop" or intermittent motion mode of operation in which substrate motion is interrupted during deposition and resumed upon completion of the deposition.

The foregoing discussion and description are not meant to be limitations upon the practice of the present invention, but rather illustrative thereof. It is to be appreciated by persons of skill in the art that numerous equivalents of the illustrative embodiments disclosed herein exist. It is the following claims, including all equivalents and obvious variations thereof, in combination with the foregoing disclosure which define the scope of the invention.

We claim:

1. A method for forming an electrical switching material comprising the steps of:
   forming a multilayer structure, said forming including:
      depositing a first layer having a first composition, said first composition including a chalcogen element;
      depositing a second layer having a second composition, said second composition differing from said first composition; and
   applying energy to convert said multilayer structure to a third layer having a third composition, said third composition differing from said first composition and said second composition, said third layer comprising a phase-change material, said phase-change material being reversibly transformable between a crystalline phase and an amorphous phase.

2. The method of claim 1, wherein said chalcogen element is Te or Se.

3. The method of claim 1, wherein said first layer further comprises Ge.

4. The method of claim 1, wherein said first layer further comprises Sb.

5. The method of claim 1, wherein said first layer comprises Te and Ge.

6. The method of claim 5, wherein said first layer comprises GeTe.

7. The method of claim 1, wherein said first layer comprises Te, Sb, and Ge.

8. The method of claim 7, wherein said first layer comprises $Ge_2Sb_2Te_5$.

9. The method of claim 1, wherein said first layer comprises In.

10. The method of claim 1, wherein said second layer consists essentially of a single element.

11. The method of claim 10, wherein said single element is a column III element.

12. The method of claim 11, wherein said column III element is In.

13. The method of claim 10, wherein said single element is Ge.

14. The method of claim 10, wherein said first layer comprises Te.

15. The method of claim 14, wherein said first layer further comprises Ge, Sb or In.

16. The method of claim 1, wherein said first layer is deposited by a vapor phase deposition process, said vapor phase deposition process including: providing a deposition chamber; delivering one or more deposition precursors to said deposition chamber, said deposition precursors being delivered in vapor phase form, at least one of said deposition precursors comprising said chalcogen element; said deposition precursors reacting to form said first layer.

17. The method of claim 16, wherein said precursor comprising said chalcogen element includes a bond between said chalcogen element and a first carbon.

18. The method of claim 17, wherein said precursor comprising said chalcogen element further includes a bond between said chalcogen element and a second carbon.

19. The method of claim 17, wherein said precursor comprising said chalcogen element further includes a bond between said chalcogen element and nitrogen.

20. The method of claim 17, wherein said chalcogen element is Se or Te.

21. The method of claim 16, wherein said precursor comprising said chalcogen element includes a bond between said chalcogen element and an alkyl group.

22. The method of claim 21, wherein said alkyl group is a propyl group.

23. The method of claim 16, wherein said precursor comprising said chalcogen element includes a bond between said chalcogen element and nitrogen.

24. The method of claim 23, wherein said chalcogen element is Se or Te.

25. The method of claim 16, wherein said precursor comprising said chalcogen element includes a bond between said chalcogen element and an amine group.

26. The method of claim 16, wherein said first layer further comprises a column III element.

27. The method of claim 26, wherein said first layer further comprises In.

28. The method of claim 26, wherein said first layer further comprises Sb.

29. The method of claim 28, wherein said chalcogen element is Te.

30. The method of claim 16, wherein said one or more deposition precursors includes at least two deposition precursors.

31. The method of claim 30, wherein said at least two deposition precursors include said precursor comprising said chalcogen element and a precursor comprising a column V element.

32. The method of claim 31, wherein said precursor comprising said column V element includes a bond between said column V element and nitrogen.

33. The method of claim 31, wherein said column V element is Sb.

34. The method of claim 31, wherein said at least two deposition precursors further include a precursor comprising a column IV element.

35. The method of claim 34, wherein said column IV element is Ge.

36. The method of claim 16, wherein said second layer is deposited by a vapor phase deposition process, said vapor phase deposition process including delivering one or more second layer deposition precursors to said deposition chamber, said second layer deposition precursors being delivered in vapor phase form, said second layer deposition precursors reacting to form said second layer.

37. The method of claim 36, wherein said one or more second layer deposition precursors includes a deposition precursor comprising Sb.

38. The method of claim 37, wherein said one or more second layer deposition precursors includes a deposition precursor comprising Ge or In.

39. The method of claim 1, wherein said second layer comprises a chalcogen element.

40. The method of claim 39, wherein said second layer is deposited by a vapor phase deposition process, said vapor phase deposition process including delivering one or more deposition precursors to said deposition chamber, said deposition precursors being delivered in vapor phase form, said deposition precursors reacting to form said second layer on said first layer, said chalcogen element of said second layer being provided by one of said second layer deposition precursors.

41. The method of claim 40, wherein said precursor comprising said chalcogen element of said second layer includes a bond between said chalcogen element of said second layer and a first carbon.

42. The method of claim 41, wherein said precursor comprising said chalcogen element of said second layer further includes a bond between said chalcogen element of said second layer and a second carbon.

43. The method of claim 41, wherein said precursor comprising said chalcogen element of said second layer further includes a bond between said chalcogen element of said second layer and nitrogen.

44. The method of claim 41, wherein said chalcogen element is Se or Te.

45. The method of claim 40, wherein said precursor comprising said chalcogen element of said second layer includes a bond between said chalcogen element of said second layer and an alkyl group.

46. The method of claim 45, wherein said alkyl group is a propyl group.

47. The method of claim 40, wherein said precursor comprising said chalcogen element of said second layer includes a bond between said chalcogen element of said second layer and nitrogen.

48. The method of claim 40, wherein said precursor comprising said chalcogen element of said second layer includes a bond between said chalcogen element of said second layer and an amine group.

49. The method of claim 47, wherein said chalcogen element of said second layer is Se or Te.

50. The method of claim 40, wherein said second layer further comprises a column III element.

51. The method of claim 50, wherein said second layer further comprises In.

52. The method of claim 50, wherein said second layer further comprises Sb.

53. The method of claim 52, wherein said second layer further comprises Te.

54. The method of claim 40, wherein said one or more deposition precursors includes at least two deposition precursors.

55. The method of claim 54, wherein said at least two deposition precursors include said precursor comprising said chalcogen element of said second layer and a precursor comprising a column V element.

56. The method of claim 55, wherein said precursor comprising said column V element includes a bond between said column V element and nitrogen.

57. The method of claim 55, wherein said column V element is Sb.

58. The method of claim 55, wherein said at least two deposition precursors further include a precursor comprising a column IV element.

59. The method of claim 58, wherein said column IV element is Ge.

60. The method of claim 40, wherein second layer deposition precursors comprise Ge or In.

61. The method of claim 1, wherein said applying energy to convert induces a transfer of atoms from said second layer to said first layer.

62. The method of claim 61, wherein said applying energy to convert further induces a transfer of atoms from said first layer to said second layer.

63. The method of claim 1, wherein said applying energy to convert includes melting one of said first layer or said second layer.

64. The method of claim 63, wherein said applying energy to convert includes melting both said first layer and said second layer.

65. The method of claim 1, wherein said energy is electrical energy.

66. The method of claim 1, wherein said third layer comprises one or more compounds, said one or more compounds including at least one element from said first layer and one element from said second layer.

67. The method of claim 1, wherein said third layer has a threshold voltage, said third layer switching from a resistive state to a conductive state upon application of said threshold voltage.

68. The method of claim 67, wherein said first layer does not exhibit electrical switching.

69. The method of claim 68, wherein said second layer does not exhibit electrical switching.

70. The method of claim 1, wherein said first layer is crystalline.

71. The method of claim 1, wherein said second layer is formed on said first layer.

72. The method of claim 1, wherein said second layer lacks a chalcogen element.

73. The method of claim 1, wherein said second layer does not include a phase-change material.

74. The method of claim 1, wherein said first layer does not include a phase-change material.

* * * * *